United States Patent
Rasmussen et al.

(10) Patent No.: US 6,638,445 B2
(45) Date of Patent: *Oct. 28, 2003

(54) SILICON DIOXIDE ETCH PROCESS WHICH PROTECTS METALS

(75) Inventors: Robert T. Rasmussen, Boise, ID (US); Surjit S. Chadha, Meridian, ID (US); David A. Cathey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/149,474

(22) Filed: Sep. 8, 1998

(65) Prior Publication Data

US 2001/0038090 A1 Nov. 8, 2001

Related U.S. Application Data

(60) Continuation of application No. 08/782,531, filed on Jan. 10, 1997, now Pat. No. 5,885,477, which is a division of application No. 08/480,846, filed on Jun. 7, 1995, now Pat. No. 5,695,661.

(51) Int. Cl.$^7$ .............................................. C09K 13/00
(52) U.S. Cl. .................... 252/79.1; 252/79.2; 252/79.3; 252/79.4
(58) Field of Search .............................. 252/79.1, 79.2, 252/79.3, 79.4

(56) References Cited

U.S. PATENT DOCUMENTS

| | | | |
|---|---|---|---|
| 2,622,016 A | 12/1952 | Gilstrap et al. | 41/42 |
| 3,616,098 A | 10/1971 | Falls | 16/1 |
| 3,671,437 A | 6/1972 | Pless | 252/79.3 |
| 3,860,464 A | 1/1975 | Erdman et al. | 436/527 |
| 4,040,897 A | 8/1977 | Blish, II et al. | 216/97 |
| 4,265,699 A * | 5/1981 | Ladany | 156/663 |
| 4,343,676 A | 8/1982 | Tarng | 438/695 |
| 4,735,906 A | 4/1988 | Bastiaans | 436/527 |
| 4,863,563 A | 9/1989 | Scardera et al. | 216/99 |
| 4,921,572 A | 5/1990 | Roche | 216/99 |
| 5,120,605 A * | 6/1992 | Zuel et al. | 428/410 |
| 5,164,018 A | 11/1992 | Barcelona | 252/79.3 |
| 5,281,350 A | 1/1994 | Gimm et al. | 252/79.4 |
| 5,320,709 A * | 6/1994 | Bowden et al. | 156/667 |
| 5,496,485 A | 3/1996 | Maternaghan | 252/79.3 |
| 5,695,661 A * | 12/1997 | Rasmussen et al. | 216/97 |
| 5,885,477 A * | 3/1999 | Rasmussen et al. | 252/79.2 |

* cited by examiner

Primary Examiner—George Goudreau
(74) Attorney, Agent, or Firm—Hale and Dorr LLP

(57) ABSTRACT

The present invention is directed to a novel etching process for a semiconductor material which inhibits corrosion of metal comprised of pretreating the material, preferably with a surfactant, and then exposing the material to a mixture comprising salt, a buffered oxide etch, and optionally a surfactant.

4 Claims, No Drawings

SILICON DIOXIDE ETCH PROCESS WHICH PROTECTS METALS

This application is a continuation of U.S. Pat. No. 5,885,477, filed Jan. 10, 1997, which is a divisional of U.S. Pat. No. 5,695,661, filed Jun. 7, 1995, the contents of which are hereby incorporated by reference.

FIELD OF THE INVENTION

The invention relates to a process for etching glass or $SiO_2$ with metal present wherein the metal is not etched during the etching of the glass or $SiO_2$.

BACKGROUND OF THE INVENTION

It is customary in the art to etch glass (amorphous $SiO_2$ films) with an aqueous solution of an acid, for example hydrofluoric acid, buffered with, e.g., ammonium fluoride. In the semiconductor industry, it is commonly necessary to etch semiconductor materials like glass formed on a metal substrate, such as aluminum, or to etch glass having metal conducting lines on a silicon wafer or die. The acid during the etching process attacks and corrodes the metal.

It has been reported that the addition of an expensive diol alcohol to a buffered acid etching solution inhibits its attack upon the metal. Moreover, it has been reported that a suitable amount of diol alcohol, e.g., ethylene glycol, to obtain this result is somewhere on the order of fifty percent of the etching solution. For example, it has been stated in U.S. Pat. No. 4,040,897 that a typical formulation using a diol alcohol to inhibit attack upon the metal is comprised as follows: five parts of a buffered oxide etch ("BOE") comprising thirty-four parts by weight of a forty percent aqueous ammonium fluoride solution, five parts of a forty-nine percent aqueous hydrofluoric acid solution, five parts of ethylene glycol and three parts water. In the same patent, it is reported that the diol alcohol containing etchant solution is nearly saturated and that it has a high viscosity which renders it difficult to rinse off and/or to etch small openings in a photoresist. It is also reported that the diol alcohol mixture tends to corrode the metal intermittently.

U.S. Pat. No. 4,040,897 titled "Etchants for Glass Films on Metal Substrates" discloses a method of etching a glass layer on a metal substrate comprising contacting the glass layer with a dilute aqueous etch solution for a sufficient time to etch through the glass layer. The etch solution disclosed in U.S. Pat. No. 4,040,897 is comprised of a buffered hydrofluoric acid, sodium chloride, and a fluorocarbon surfactant. However, it has been found that using the process disclosed in U.S. Pat. No. 4,040,897 does not completely protect the metal from attack and thus corrosion. Indeed, it has been found that upon exposure to the etchant solution and before the surfactant can coat the metal, the metal is attacked by the acid etchant and corroded to some extent. In addition, it has been found that the above-discussed processes do not protect the metal substrate from galvanic action which is frequently encountered in wet etching processes with semiconductor materials.

SUMMARY OF THE INVENTION

The invention is directed to an etching process for semiconductor materials which protects metals from corrosion comprising: (1) pretreating the material to be etched (to protect the metal), and (2) exposing said material to a mixture of a buffered oxide etch and a salt. The salt is added in a sufficient amount so that the mixture maintains a natural saturation equilibrium during the etching process or any electrolysis effects are neutralized. Preferably, the material is pretreated with a surfactant. Alternatively, the process of the present invention may include pretreating only the metal with a surfactant. In addition, the exposing step may include a surfactant.

The invention is also directed to an etchant for semiconductor materials comprising: (1) from about 0.03 to about 0.06 percent by weight surfactant, (2) from about 15 to about 30 percent by weight buffered oxide etch, and (3) a salt in sufficient quantity to neutralize electrolysis effects.

The invention is further directed to a semiconductor material etched by the process of the present invention. The process comprises: (1) pretreating the material with a fluorocarbon surfactant, and (2) exposing said pretreated material to an etchant bath comprising from about 2 to about 4 percent by weight salt, from about 16 to about 28 percent by weight buffered oxide etch, and (3) agitating the bath. The etchant bath is preferably comprised of sodium chloride in an amount such that the bath maintains a natural saturation equilibrium. Optionally, if desired, the etchant bath may include a surfactant.

DETAILED DESCRIPTION OF THE INVENTION

The aqueous etching solution of the present invention is directed to the etching of glass or $SiO_2$ wherein metal is present. More specifically, the etching process of the present invention is directed to a process for etching glass wherein metal is present without attacking and/or thus corroding the metal during the etching process. The etching solution of the present invention includes conventional buffered oxide etches ("BOE"), a salt, and a surfactant. In addition to the water of the BOE solution, more water may be added to the overall etching solution.

Conventional buffered oxide etch solutions may be employed in the practice of the present invention. Conventional BOEs may be comprised of varying ratios of ammonium fluoride and hydrofluoric acid in an aqueous solution. The preferred BOE is ammonium fluoride "BOE 410" manufactured by Olin and Hunt which is comprised of ammonium fluoride, hydrofluoric acid and water in the following ratio: four parts of a 28.5 to 40 percent ammonium fluoride solution, one part of a 7.0 to 8.4 percent hydrofluoric acid solution, and five parts water. In addition, a BOE 710 may be utilized which is comprised of: seven parts of a 33 to 35 percent ammonium fluoride solution, one part of a 6 to 9 percent hydrofluoric acid solution, and two parts water.

A preferable salt useful in the practice of the present invention is sodium chloride. However, other alkali halide salts may be used in the practice of the present invention. For example, potassium chloride, potassium bromide, sodium bromide, cesium chloride, cesium bromide, rubidium chloride and rubidium bromide may be utilized.

In order to help protect the metal from corrosion, it has been found that it is necessary to always keep the etching solution at a natural saturation equilibrium. It is believed this neutralizes the electrolysis effects of the process. To achieve this, it has been found necessary to always keep the salt in excess of its solubility limit in the solution. This can be ensured by adding the salt last during the preparation of the etchant bath. Preferably, the etching solution or bath includes an excess amount of solid salt settled in the bottom of the etching container.

In the practice of the present invention, preferably a surfactant is employed which is not detrimental to the etching process but, is however capable of protecting the metal substrate from attack by the acid in the etch. Surfactants useful in the practice of the present invention include the fluorocarbon surfactants: "Fluorad FC-120", "Fluorad FC-129" and "Fluorad FC-135". Fluorad FC-120, FC-129, and FC-135 are manufactured by the Specialty Chemicals Division of 3M. FC-120 is comprised of: (1) 37.5 percent by weight 2-butoxyethanol, (2) 36.0–39.0 percent by weight water, (3) 21.0–24.0 percent ammonium perfluoralkyl sulfonate (C10), (4) 1.0–3.0 percent by weight ammonium perfluoralkyl sulfonate (C8), and (5) 0.1–1.0 percent by weight diisopropyl ether. FC-129 comprises: (1) 40.0–44.0 percent by weight potassium fluoralkyl carboxylate (C8), (2) 32.0 percent by weight water, (3) 14.0 percent by weight 2-butoxyethanol, (4) 4.0 percent by weight ethanol, (5) 1.0–5.0 percent by weight potassium fluoralkyl carboxylate (C6), (6) 1.0–5.0 percent potassium fluoralkyl carboxylate (C4), (7) 1.0–3.0 percent by weight potassium fluoralkyl carboxylate (C7), and (8) 0.1–1.0 percent by weight potassium fluoralkyl carboxylate (C5). FC-135 comprises: (1) 40.0 to 44.0 percent by weight fluoralkyl quaternary ammonium iodide (C8), (2) 33.0 percent by weight isopropyl alcohol, (3) 17.0 percent by weight water, (4) 1.0–5.0 percent by weight fluoralkyl quaternary ammonium iodide (C6), (5) 1.0–4.0 percent by weight fluoralkyl quaternary ammonium iodide (C7), (6) 1.0–4.0 percent by weight fluoralkyl quaternary ammonium iodide (C4), (7) 1.0–2.0 percent by weight fluoralkyl quaternary ammonium iodide, and (8) 0.1 percent by weight omethyl iodide.

In the practice of the present invention, the following steps may be followed: (1) the semiconductor material is pretreated, preferably by exposure to about 500 to 1000 ppm surfactant for approximately one minute (however, other amounts of surfactant for varying amounts of time may be utilized depending upon the particular surfactant used and the amount and type of metal to be protected), and (2) the semiconductor material is exposed to the etching solution for the necessary time to achieve the result desired, e.g., removal of oxide.

The etching solution or mixture is made by adding the following constituents into a container in the order listed: (1) from about 70 weight percent to about 80 weight percent water, (2) from about 15 weight percent to about 30 weight percent buffered oxide etch, and (3) from about 2 weight percent to about 4 weight percent salt. In addition, the etchant bath may include from about 0.03 to about 0.06 weight percent surfactant. Preferably, the etchant, etching solution or mixture is comprised of 0.05 percent by weight surfactant, 4.0 percent by weight sodium chloride, 76.95 percent by weight water, and 19.0 percent by weight BOE 410. It should be recognized that while it is preferred to use the same surfactant for the pretreatment step and the exposing step it is not required. In fact, if pretreated appropriately, there is no need for a surfactant in the exposure step of the process in certain circumstances, e.g., when the etch time is very short.

In the normal etching process, that is, comprising an etching bath, the semiconductor material is dipped into the bath for the necessary time to achieve the desired result under agitation. Upon completion of the desired purpose, for example, the removal of oxide, the semiconductor material is preferably rinsed for approximately one minute with, for example, deionized water.

In the preparation of the etching solution and/or bath as stated above, it has been found necessary to keep the salt, for example, sodium chloride, in excess of its solubility limit in the solution. The excess salt keeps the solution at a natural equilibrium which is believed necessary to neutralize the electrolysis effects of the etching process so that the metal is not attacked or corroded. It is important to note that the mixing order of the bath is specific, as set forth above. For instance, if the salt is totally dissolved in the water prior to the addition of the remaining constituents, then the metal will delaminate from the substrate instantaneously from areas where galvanic action occurs. It is believed this is due to the excess sodium and chloride ions in the solution. On the other hand, if the salt is left out completely, corrosion of the metal may occur in areas where the opposite galvanic reaction occurs.

While the invention is acceptable to various modifications and alternate forms, specific embodiments have been shown by way of example and have been described in detail herein. However, it should be understood that the invention is not intended to be limited to particular embodiments disclosed. Rather, the invention is to cover all modifications, equivalents and alternatives falling within the spirit and the scope of the invention as defined by the appended claims.

We claim:

1. An etchant for a pretreated semiconductor material having a metal component comprising:
   from about 0.03 to about 0.06 percent by weight surfactant to protect the metal component of the semiconductor material from corrosion;
   from about 15 to about 30 percent by weight buffered oxide etch; and
   from about 2 to about 4 percent by weight salt, the amount of salt being in excess of a solubility limit for the etchant.

2. The etchant of claim 1 wherein the surfactant is a fluorocarbon.

3. The etchant of claim 1 wherein the salt is sodium chloride.

4. The etchant of claim 1 wherein the buffered oxide etch comprises ammonium fluoride, hydrofluoric acid, and water.

* * * * *